United States Patent
Thanner et al.

(10) Patent No.: US 9,823,296 B2
(45) Date of Patent: Nov. 21, 2017

(54) BUILT-IN SELF TEST SYSTEM, SYSTEM ON A CHIP AND METHOD FOR CONTROLLING BUILT-IN SELF TESTS

(75) Inventors: Manfred Thanner, Neubiberg (DE); Carl Culshaw, Wigan (GB); Juergen Frank, Munich (DE); Michael Staudenmaier, Munich (DE)

(73) Assignee: NXP USA, Inc., Austin, TX (US)

( * ) Notice: Subject to any disclaimer, the term of this patent is extended or adjusted under 35 U.S.C. 154(b) by 367 days.

(21) Appl. No.: 14/402,949

(22) PCT Filed: Jun. 7, 2012

(86) PCT No.: PCT/IB2012/052879
§ 371 (c)(1),
(2), (4) Date: Nov. 21, 2014

(87) PCT Pub. No.: WO2013/182872
PCT Pub. Date: Dec. 12, 2013

(65) Prior Publication Data
US 2015/0137841 A1     May 21, 2015

(51) Int. Cl.
*G01R 31/3187*    (2006.01)
*G01R 31/28*    (2006.01)
*G01R 31/317*    (2006.01)

(52) U.S. Cl.
CPC ... *G01R 31/2856* (2013.01); *G01R 31/31701* (2013.01); *G01R 31/31721* (2013.01)

(58) Field of Classification Search
CPC ............ G01R 31/31924; G01R 19/257; G01R 31/2884; G01R 31/3004; G01R 31/3181; G01R 31/31813
See application file for complete search history.

(56) References Cited

U.S. PATENT DOCUMENTS

| | | |
|---|---|---|
| 5,377,200 A | 12/1994 | Pedneau |
| 6,330,681 B1 | 12/2001 | Cote et al. |
| 7,795,894 B1 | 9/2010 | Sogani |
| 7,895,491 B2 | 2/2011 | Wong |
| 2003/0070118 A1 | 4/2003 | Nakao et al. |
| 2007/0226568 A1* | 9/2007 | Anzou ............. G01R 31/31857 714/733 |

OTHER PUBLICATIONS

International Search Report and Written Opinion corralating to PCT/IB2012/052879 dated Jan. 30, 2013.

* cited by examiner

*Primary Examiner* — Tung X Nguyen

(57) ABSTRACT

A built-in self test system comprises an integrated circuit device comprising a plurality of functional units coupled to built-in self test circuitry; a low power control unit operable to switch the integrated circuit device into a low power mode and to generate a BIST wake-up signal during or before entering the low power mode; and a built-in self test control unit coupled to the built-in self test circuitry and the low power control unit and arranged to initiate a built-in self test when receiving the BIST wake-up signal.

16 Claims, 4 Drawing Sheets

BUILT-IN SELF TEST SYSTEM, SYSTEM ON A CHIP AND METHOD FOR CONTROLLING BUILT-IN SELF TESTS

FIELD OF THE INVENTION

This invention relates to a built-in self test system, a system on a chip (SoC) and a method for controlling built-in self tests with low power.

BACKGROUND OF THE INVENTION

Electronic devices or integrated circuit devices, such as, for example, processing devices or memory devices, are used in a variety of technical fields and may, for example, be used in safety critical systems, for example in automotive safety critical systems, where failure or malfunction of the device may result in damage or dangerous situations for a user of the safety critical system, e.g. a car driver. In order to specify functional safety, for example, for automotive applications, functional safety standards are defined, for example the ISO 26262 functional safety standard by the International Organization for Standardization (ISO) or the IEC 61508 standard by the International Electrotechnical Commission (IEC). For example, ISO 26262 defines levels of failure risk reduction wherein, for example, acceptable process safety times according to certain safety integrity levels (SIL) are defined. Process safety times are periods of time wherein a very low probability of failure of the integrated circuit device can be expected.

Functional safety of an integrated circuit device may, for example, be tested using built-in self test (BIST) circuitry implemented as part of the integrated circuit device together with the application circuitry and associated with the application circuitry such that internal functional units of the application circuit become accessible for test patterns during a built-in self test. Circuits such as flip-flop circuits may, for example, be connected to form a long shift register or scan chain, through which a test pattern may be loaded into the integrated circuit in order to put the integrated circuit in a defined test state. After performing a test of at least one clock cycle duration a test result pattern, i.e. a resulting signature bit sequence may be received from the integrated circuit through the scan chain. In case of correct functioning of the device, the received signature is identical to an expected signature. A self test of an integrated circuit device is often performed during an initialization or power up period, and/or during a shutdown or power down period of the device or sometimes during run time of the device, i.e., during being powered on.

SUMMARY OF THE INVENTION

The present invention provides a built-in self test system, a system on a chip and a method for controlling built-in self tests as described in the accompanying claims.

Specific embodiments of the invention are set forth in the dependent claims.

These and other aspects of the invention will be apparent from and elucidated with reference to the embodiments described hereinafter.

BRIEF DESCRIPTION OF THE DRAWINGS

Further details, aspects and embodiments of the invention will be described, by way of example only, with reference to the drawings. In the drawings, like reference numbers are used to identify like or functionally similar elements. Elements in the figures are illustrated for simplicity and clarity and have not necessarily been drawn to scale.

DETAILED DESCRIPTION OF THE PREFERRED EMBODIMENTS

Because the illustrated embodiments of the present invention may for the most part, be implemented using electronic components and circuits known to those skilled in the art, details will not be explained in any greater extent than that considered necessary, as illustrated, for the understanding and appreciation of the underlying concepts of the present invention and in order not to obfuscate or distract from the teachings of the present invention.

Figure 1:
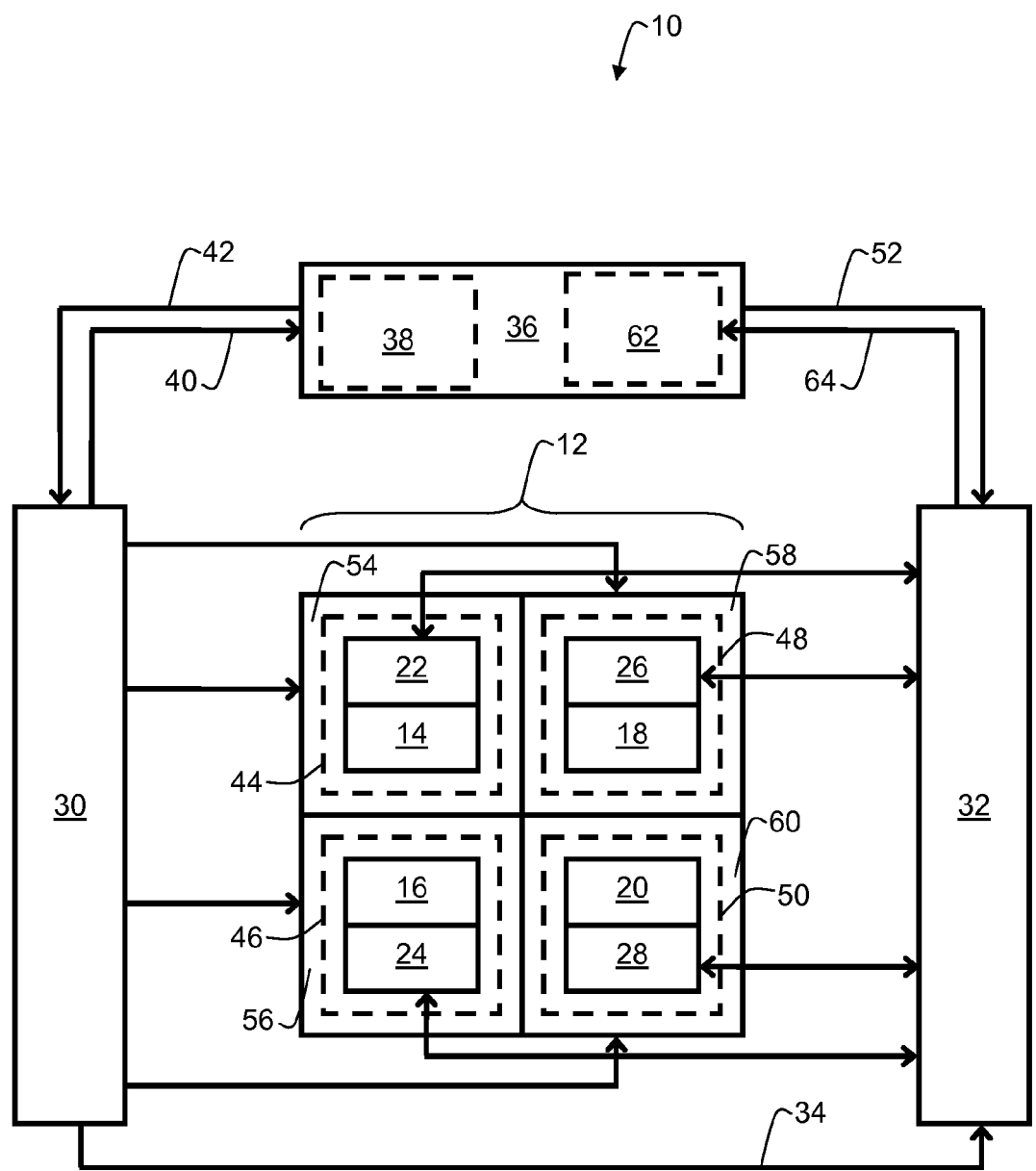
FIG. 1 schematically shows a block diagram of an example of an embodiment of a built-in self test system.

Referring to FIG. 1, a block diagram an example of an embodiment of a built-in self test system is schematically shown. A built-in self test system 10 comprises an integrated circuit device 12 comprising a plurality of functional units 14, 16, 18, 20 coupled or connected to built-in self test circuitry 22, 24, 26, 28. The built-in self test system 10 also comprises a low power control unit 30 operable to switch the integrated circuit device 12 into a low power mode and to generate a BIST wake-up signal during or before entering the low power mode, and a built-in self test control unit 32 coupled or connected to the built-in self test circuitry 22, 24, 26, 28 and the low power control unit 30 and arranged to initiate a built-in self test when receiving the BIST wake-up signal. The term "wake-up signal during the low power mode" may comprise that the wake-up signal is generated at the time of or after entering the low power mode.

The built-in self test system 10 may comprise any electronic device as the integrated circuit device 12, for example a memory device such as, for example, a register, cache or random access memory, or an analog-to-digital converter (ADC) or a processing device, such as a microprocessor or microcontroller unit, just to name a few. A functional unit 14, 16, 18, 20 of an integrated circuit device 12 may refer to a piece of circuitry, such as a flip flop circuit or a larger unit such as a module dedicated to perform a more complex functionality. Built-in self test circuitry 22, 24, 26, 28 may, for example, comprise switching devices and storage devices, such as flip flop circuits operable to form one or more scan chain registers from the built-in self test circuitry and/or at least a portion of the connected functional units 14, 16, 18, 20.

The shown built-in self test system 10 may, for example, provide execution of self tests of the device 12 independently of being triggered by, for example, a power on or power off event. The system 10 may be suitable for applications, such as many of today's car body applications, where the devices may remain permanently on, at least in a low power mode or sleep mode. This mode may save significant electrical power consumption compared to leaving the device fully on and idle, but may, for example, allow to avoid a reset of the device or to wait for a machine comprising the integrated circuit device to reboot. A low power control unit 30 may switch the integrated circuit device 12 into low power mode in case the device running idle, in order to reduce power consumption. During low power mode, the low power control unit 30 may, for example, call or trigger the integrated circuit device 12 for receiving an alive signature. Periodical wake-up signals sent to the integrated circuit device 12 may not be related to any functional safety process times as defined, for example, by functional safety standards such as ISO 26262. The shown low power control unit 30, which may, for example, comprise or be comprised in a processing circuit or logic circuitry, and may also generate a BIST wake-up signal, i.e. a signal arranged to trigger the shown BIST control unit 32 to initiate a built-in self test of the integrated circuit device 12. This may allow performing built-in self tests during low power mode without activation of a processing core and related software execution. The BIST wake-up signal may, for example, be communicated from the low power control unit 30 to the BIST control unit 32 via a first connecting line 34, such as a metal line or other conductive line.

Triggering built-in self tests during low power mode instead of, for example, during a power up sequence, which may, for example, be performed by processing devices, may allow for a faster power up sequence and earlier availability of the running device. Power consumption may be reduced as no start up code or related initialization procedure may be executed.

Often, an integrated circuit device 12 may be switched into low power mode not directly after being powered up but after being used in running mode. This may enable a BIST which is performed in low power mode, with the integrated circuit device 12 being at operational temperature. This may allow for an improved coverage of temperature dependent faults as compared with a BIST performed directly after the device being powered up, where the integrated circuit device may still be at ambient temperature and not at typical operational temperature.

The BIST control unit 32 may, for example, comprise or be comprised in a processing circuit or logic circuitry. It may, for example, comprise a cache, register or other storage device for storing test patterns and expected test result patterns to be used for testing the integrated circuit device 12.

As shown in FIG. 1, the built-in self test system 10 may comprise a self test supervision unit 36 connected to the low power control unit 30 and comprising a process safety timer 38. The low power control unit 30 may be arranged to provide a trigger signal to the process safety timer 38 of the self test supervision unit 36 when switching the integrated circuit device 12 into the low power mode. The trigger signal may be communicated to the process safety timer 38 via a second connecting line 40, which may, for example, be a metal line or other conductive line. The process safety timer 38 may, for example, be arranged to generate a process safety timer expiration trigger signal after a period of time corresponding to a pre-defined process safety time, i.e. a period of time between cyclical repetitions of a self test. In an embodiment, the process safety timer 38 may be controllable or programmable by the self test supervision unit 36 and may be arranged to generate different process safety timer expiration trigger signals.

The self test supervision unit 38 may be arranged to provide the process safety timer expiration trigger signal to the low power control unit 30 on expiration of the process safety timer. This may allow to ensure process safety time triggered BIST through a hardware mechanism.

The process safety timer expiration trigger signal may, for example, be communicated to the low power control unit 30 via a third connecting line 42, which may be any conductive line. In other embodiments, the second connecting line may, for example, be used bidirectionally.

The low power control unit 30 may then be arranged to generate the BIST wake-up signal depending on the process safety timer expiration trigger signal. As an example, the low power control unit 30 may generate the BIST wake-up signal when receiving the process timer expiration trigger signal, i.e. the built-in self test control unit 32 may initiate a self test of the integrated circuit device 12 each time the corresponding functional safety period expires. Or the low power self test unit 30 may, for example, introduce an additional delay before triggering the BIST wake-up signal, e.g., for synchronization purposes. In other embodiments, the process safety timer expiration signal may, for example, be directly provided to the built-in self test control unit 32. As an example, the self test supervision unit 38 may be arranged to provide the process safety timer expiration trigger signal to the built-in self test control unit 32 and/or the low power control unit 30.

As shown, built-in self test performed during low power mode may allow to perform the self tests more depending only on, e.g., functional safety period values, whereas performing BIST during power up or power down sequences may only allow for an arbitrary period of time between self tests which may be very long in case the integrated circuit device 12 is powered up and down only very seldom. Performing built-in self tests during low power mode may also avoid performing the self test during run time and may allow performing built-in self tests within the functional safety periods of time and at the same time avoid or at least reduce conflicts with processing requirements of applications associated with the integrated circuit device 12.

As schematically illustrated in FIG. 1, the built-in self test circuitry 22, 24, 26, 28 may be comprised in a plurality of BIST regions 44, 46, 48, 50 independently testable by the built-in self test unit 32. On reception of the BIST wake-up signal, one or more of the BIST regions 44, 46, 48, 50 may be tested, for example, according to a test order known by the built-in self test unit 32, which may or may not be programmable. The test order may, for example, be stored in a memory (not shown) comprised in or connected to the built-in self test unit 32. Or the test order may be stored in the self test supervision unit 36. The self test supervision unit 36 may, for example, be arranged to provide a selection signal to the built-in self test unit 32 for selecting a next BIST region for test. The selection signal may, for example, be communicated to the built-in self test control unit 32 via a fourth connecting line 52, which may, for example, be any conductive line. BIST regions 44, 46, 48, 50 may comprise different entities of identical functional units, e.g. different processing cores of a multi-core processing device, and/or BIST regions 44, 46, 48, 50 may comprise different functional units dedicated to different application purposes, e.g. logic circuits and memory circuits.

The built-in self test control unit 32 may be arranged to initiate different built-in self tests for at least some of said plurality of BIST regions 44, 46, 48, 50, i.e., the built-in self test control unit 32 may be arranged to initiate suitable self tests for some or each of the BIST regions, e.g. logic built-in self tests (LBIST) for logic circuitry or memory built-in self tests (MBIST) for memory circuitry. Other hardware BIST may be applied, such as ADC self tests, flash array integrity tests, configuration register cyclic redundancy checks (CRC), just to name a few.

It should be noted that the process safety timer 38 may, for example, be a programmable timer or may be implemented as a plurality of timers, thereby allowing to generate the trigger signal with respect to a plurality of different functional safety periods and to provide the trigger signal corresponding to the next BIST region to be tested and next built-in self test to be performed.

As shown in FIG. 1, the integrated circuit device 12 may comprise a plurality of power domains 54, 56, 58, 60. A power domain may be switchable, for example, into low power mode or full power mode independently of the current power mode associated with the remaining power domains. Each of the plurality of BIST regions 44, 46, 48, 50 may be aligned with a single one of the plurality of power domains 54, 56, 58, 60, i.e., BIST regions may, for example, not spread across more than one power domain. This may, for example, help reduce complexity of controlling the self tests. At least one of the plurality of BIST regions 44, 46, 48, 50 may, for example, be arranged to selectively receive power during low power mode.

In another embodiment, it may be possible to have BIST regions 44, 46, 48, 50 across power domain borders in order to allow more complex built-in self tests using functional units of more than one power domain.

As shown in FIG. 1, the built-in self test system 10 may comprise a BIST result accumulation unit 62 arranged to receive BIST result signatures provided by the built-in self test control unit 32 and to accumulate at least some of the BIST result signatures to generate at least one accumulated BIST result signature. The BIST result accumulation unit 62 may be comprised in the self test supervision unit 36. In another embodiment, the BIST result accumulation unit 62 may, for example, be comprised in the built-in self test control unit 32. In the shown example, BIST result signatures may be communicated from the built-in self test control unit 32 to the BIST result accumulation unit 62 using a fifth signal line 64, which may, for example, be any conductive line. A BIST result signature may, for example, be a bit sequence generated by a single built-in self test, for example received by the built-in self test control unit 32 through a scan chain associated with a BIST region of the integrated circuit device 12. The BIST result accumulation unit 62 may be arranged to compare the at least one accumulated BIST result signature with a pre-defined BIST signature. A difference between the accumulated BIST result signature and the pre-defined BIST signature may indicate a fault or malfunction or intrusion into the system. Since accumulated BIST result signatures generated by accumulating BIST result signatures of a sequence of built-in self tests may be used, the accumulated BIST result signatures may serve as "finger prints", thereby allowing to detect, for example, power frauds. If, for example, the integrated circuit device 12 has been disconnected from power supply between one or more of the built-in self tests and has encountered a power up and/or power down event, BIST result signatures may be subject to change due to, for example, reset of the functional units. This may, for example, help to detect or verify manipulation by a user of the integrated circuit device 12, which may or may not be acceptable and may result in generation of an alert signal or in directly switching the device 12 into a safety state. Since the integrated circuit device 12 may already be in low power mode, the time required for shut down or move to safety state may be short.

Figure 2:
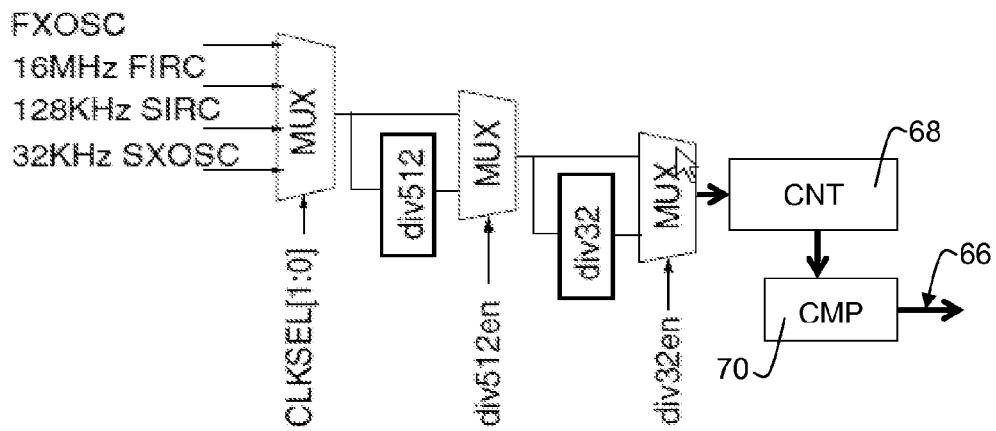
FIG. 2 schematically shows a block diagram of an example of a process safety timer FIG. 3 schematically shows a diagram of a first example of periodical BIST cycles.

Referring to FIG. 2, a block diagram of an example of a process safety timer is schematically shown. Controllable multiplexers MUX connected to different oscillation signal sources, e.g. 16 MHz FIRC, 128 kHz SIRC and 32 kHz SXOSC and division circuits div512, div32 may be used for generating a programmable signal of a selectable frequency and long term timed signal for triggering. In the shown example timer, this may be achieved by selecting the frequency using a clock selection signal CLKSEL[1:0] in combination with division enable signals div512en and div32en. As shown, the process safety timer 38 may be a programmable timer, thereby enabling to generate the trigger signal 66 with respect to a plurality of different functional safety periods and to provide the trigger signal corresponding to the next BIST region to be tested and next built-in self test to be performed. The functional safety periods may, for example, be different for different BIST regions or functional units.

Different functional safety periods may be generated using a counter 68 receiving the clock signal having the selected frequency and providing the counter output signal to a comparator register 70 arranged to compare the counter output signal with a plurality of bit signatures associated with different functional safety periods of time. Counter and comparator register may, for example, have a bit length of 32 or 64 bits. Other bit lengths may be used instead.

Figure 3:
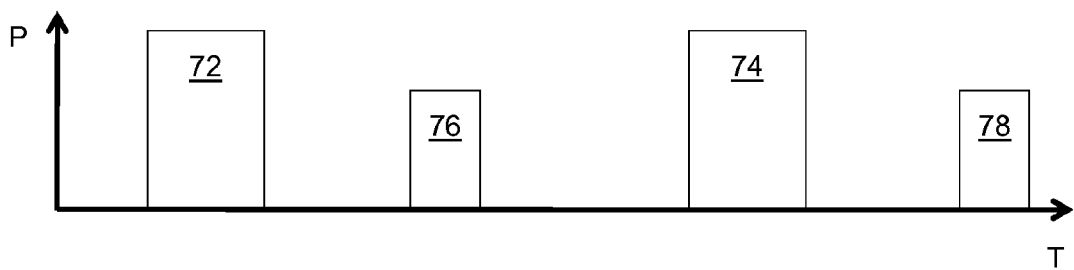
Figure 4:
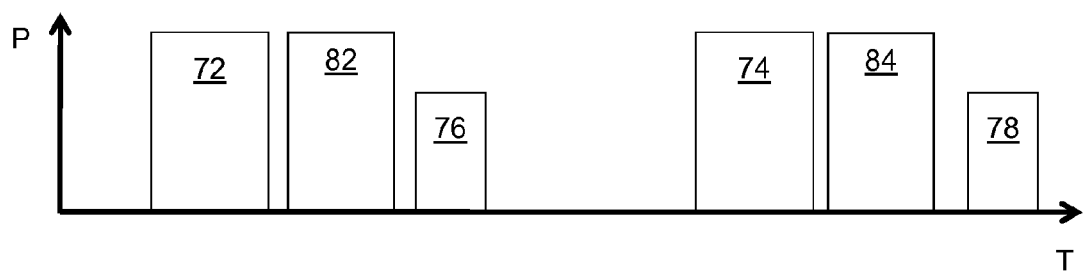
FIG. 4 schematically shows a diagram of a second example of periodical BIST cycles.
Figure 5:
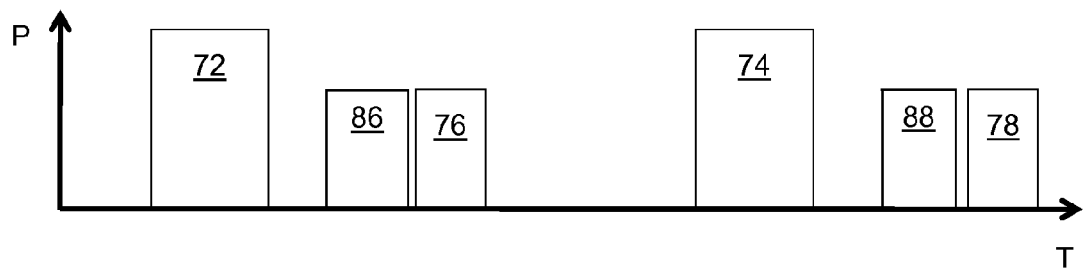
FIG. 5 schematically shows a diagram of a third example of periodical BIST cycles.

Referring to FIGS. 3 to 5, diagrams of a first, a second and a third example of periodical BIST cycles are schematically shown. In the example shown in FIG. 3, the power P consumed during periodical wake-up events 72, 74 over time T applied to an integrated circuit device in low power mode is compared with the power consumed during built-in self tests 76, 78, e.g. LBIST. In the example shown in FIG. 3, the BIST is repeated periodically with the same periodicity as the wake-up event. In other embodiments, the BIST wake-up signal may be received non-periodically or periodically with a period different from a duration of a wake-up cycle of the integrated circuit device. In the example shown in FIG. 4, built-in self tests 76, 78 are carried out less often than the integrated circuit device receives wake-up events 72, 74, 82, 84. As another example, in FIG. 5 it is shown that more than one built-in self tests 76, 78, 86, 88 may be performed within a period between two wake-up events 72, 74 of the integrated circuit device. Wake-up events may be received by the same or different power domains of the integrated circuit device. Built-in self tests may be applied to the same or to different BIST regions of the integrated circuit device.

Figure 6:
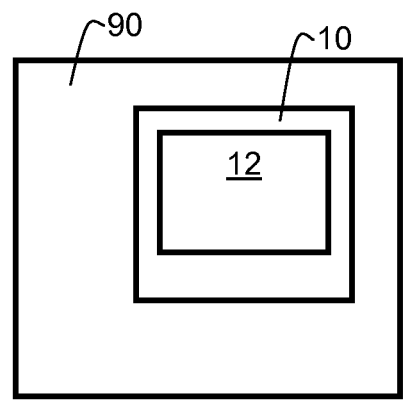
FIG. 6 schematically shows a bock diagram of an example of an embodiment of a system on a chip.

Referring to FIG. 6, a block diagram of a system on a chip 90 (SoC) comprising a built-in self test system 10 as described above is schematically shown. The system on a chip 90 may comprise the components of the built-in self test system 10, including the integrated circuit device 12, arranged, for example, within a single package. As an example, the integrated circuit device 12 may be a processing device, such as a microprocessor. The SoC 90 may, for example, be a microcontroller unit. The SoC 90 may, for example, comprise separate integrated circuits on the same chip for the components of the built-in self test system 10 or it may comprise a single integrated circuit comprising all components of the built-in self test system 10. In the latter case, the integrated circuit device 12 itself may, for example, comprise the built-in self test system.

The integrated circuit device 12 shown in FIG. 1 and FIG. 6 of the built-in self test system 10 required to comply functional safety requirements may be any suitable device, and, for example, be a safety relevant device. The device 12 may, for example, be comprised in a safety critical system, such as an automotive safety critical system, whose possible malfunction or wrong usage may endanger, for example, a user of the system, e.g. a car driver. A safety critical system may, for example, be part of electronic equipment of a power plant or a vehicle. A vehicle may for example be a car, a truck, a plane, a ship, a helicopter, etc. A safety critical system of a vehicle, i.e., an automotive safety critical system, may, for example, be an engine control unit (ECU). An automotive safety critical system may, for example, be a car safety system. A safety critical system may comprise systems such as airbags, immobilizers, a brake system or an electrical steering system. A brake system may comprise, for example, an anti-lock braking system (ABS), an electronic brakeforce distribution system (EBD), a cornering brake control (CBC) system etc. An electrical steering system may comprise, for example, an electronic stability control system (ESC), a traction control system (TCS) or anti-slip regulation system (ASR), an adaptive cruise control (ACC) system, a forward collision warning (FCW) system etc. The system may also be another type of system such as a climate control or a seat positioning system.

Figure 7:
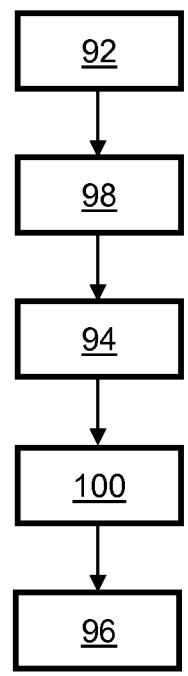
FIG. 7 schematically shows a flowchart of an example of an embodiment of a method for controlling built-in self tests.

Referring to FIG. 7, a flowchart of an example of an embodiment of a method for controlling built-in self tests is schematically shown. The method shown in FIG. 7 allows implementing the advantages and characteristics of the described built-in self test system as part of a method for controlling built-in self tests, i.e. a method for controlling built-in self tests of an integrated circuit device comprising a plurality of functional units coupled to built-in self test circuitry. The shown method comprises switching 92 the integrated circuit device into a low power mode; generating 94 a BIST wake-up signal during the low power mode; and initiating 96 a built-in self test when receiving the BIST wake-up signal.

The method may, for example, comprise providing 98 a trigger signal to a process safety timer when switching the integrated circuit device into the low power mode and generating 100 the BIST wake-up signal depending on an expiration of the process safety timer.

In the foregoing specification, the invention has been described with reference to specific examples of embodiments of the invention. It will, however, be evident that various modifications and changes may be made therein without departing from the broader spirit and scope of the invention as set forth in the appended claims.

The connections as discussed herein may be any type of connection suitable to transfer signals from or to the respective nodes, units or devices, for example via intermediate devices. Accordingly, unless implied or stated otherwise, the connections may for example be direct connections or indirect connections. The connections may be illustrated or described in reference to being a single connection, a plurality of connections, unidirectional connections, or bidirectional connections. However, different embodiments may vary the implementation of the connections. For example, separate unidirectional connections may be used rather than bidirectional connections and vice versa. Also, plurality of connections may be replaced with a single connection that transfers multiple signals serially or in a time multiplexed manner. Likewise, single connections carrying multiple signals may be separated out into various different connections carrying subsets of these signals. Therefore, many options exist for transferring signals.

Each signal described herein may be designed as positive or negative logic. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures can be implemented which achieve the same functionality. For example, the BIST control unit 32 and the self test supervision unit 36 may be implemented as a single module.

Any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

Also for example, in one embodiment, the illustrated examples may be implemented as circuitry located on a single integrated circuit or within a same device. For example, the integrated circuit device 12 and the low power control unit 30, the built-in self test control unit 32, and the self test supervision unit 36 may be implemented as circuitry located on a single integrated circuit. Alternatively, the examples may be implemented as any number of separate integrated circuits or separate devices interconnected with each other in a suitable manner. For example, the integrated circuit device 12 may be connected to the other components of the built-in self test system.

Also for example, the examples, or portions thereof, may implemented as soft or code representations of physical circuitry or of logical representations convertible into physical circuitry, such as in a hardware description language of any appropriate type.

Also, the invention is not limited to physical devices or units implemented in non-programmable hardware but can also be applied in programmable devices or units able to perform the desired device functions by operating in accordance with suitable program code, such as mainframes, minicomputers, servers, workstations, personal computers, notepads, personal digital assistants, electronic games, automotive and other embedded systems, cell phones and various other wireless devices, commonly denoted in this application as 'computer systems'.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

The invention claimed is:

1. A built-in self test system, comprising:
    an integrated circuit device comprising a plurality of functional units coupled to built-in self test circuitry;
    a low power control unit operable to switch said integrated circuit device into a low power mode and to generate a BIST wake-up signal during or before entering said low power mode;
    a built-in self test control unit coupled to said built-in self test circuitry and said low power control unit and arranged to initiate a built-in self test when receiving said BIST wake-up signal; and
    a self test supervision unit connected to said low power control unit and comprising a process safety timer, wherein said low power control unit is arranged to provide a trigger signal to said process safety timer of said self test supervision unit when switching said integrated circuit device into said low power mode.

2. The built-in self test system as claimed in claim 1, wherein said self test supervision unit is arranged to provide a process safety timer expiration trigger signal to said low power control unit on expiration of said process safety timer.

3. The built-in self test system as claimed in claim 2, wherein said low power control unit is arranged to generate said BIST wake-up signal depending on said process safety timer expiration trigger signal.

4. The built-in self test system as claimed in claim 1, wherein said self test supervision unit is arranged to provide said process safety timer expiration trigger signal to said built-in self test control unit.

5. A system on a chip, comprising a built-in self test system as claimed in claim 1.

6. A built-in self test system, comprising:
    an integrated circuit device comprising a plurality of functional units coupled to built-in self test circuitry;
    a low power control unit operable to switch said integrated circuit device into a low power mode and to generate a BIST wake-up signal during or before entering said low power mode; and
    a built-in self test control unit coupled to said built-in self test circuitry and said low power control unit and arranged to initiate a built-in self test when receiving said BIST wake-up signal, wherein said built-in self test circuitry is comprised in a plurality of BIST regions independently testable by said built-in self test unit, and wherein said self test supervision unit is arranged to provide a selection signal to said built-in self test unit for selecting a next BIST region for test.

7. The built-in self test system as claimed in claim 6 wherein said built-in self test control unit is arranged to initiate a different built-in self test for at least some of said plurality of BIST regions.

8. The built-in self test system as claimed in claim 6 wherein said integrated circuit device comprises a plurality of power domains.

9. The built-in self test system as claimed in claim 8 wherein each of said plurality of BIST regions is aligned with a single one of said plurality of power domains.

10. The built-in self test system as claimed in claim 6 wherein at least one of said plurality of BIST regions is arranged to selectively receive power during low power mode.

11. A system on a chip, comprising a built-in self test system as claimed in claim 6.

12. A built-in self test system, comprising:
    an integrated circuit device comprising a plurality of functional units coupled to built-in self test circuitry;
    a low power control unit operable to switch said integrated circuit device into a low power mode and to generate a BIST wake-up signal during or before entering said low power mode;
    a built-in self test control unit coupled to said built-in self test circuitry and said low power control unit and arranged to initiate a built-in self test when receiving said BIST wake-up signal; and
    a BIST result accumulation unit arranged to receive BIST result signatures provided by said built-in self test control unit and to accumulate at least some of said BIST result signatures to generate at least one accumulated BIST result signature, wherein said BIST result accumulation unit is arranged to compare said at least one accumulated BIST result signature with a pre-defined BIST signature.

13. A system on a chip, comprising a built-in self test system as claimed in claim 12.

14. A built-in self test system, comprising:
    an integrated circuit device comprising a plurality of functional units coupled to built-in self test circuitry;
    a low power control unit operable to switch said integrated circuit device into a low power mode and to generate a BIST wake-up signal during or before entering said low power mode; and
    a built-in self test control unit coupled to said built-in self test circuitry and said low power control unit and arranged to initiate a built-in self test when receiving said BIST wake-up signal, wherein said BIST wake-up signal is received periodically with a period different from a duration of a wake-up cycle of said integrated circuit device.

15. A system on a chip, comprising a built-in self test system as claimed in claim 14.

16. A method for controlling built-in self tests of an integrated circuit device comprising a plurality of functional units coupled to built-in self test circuitry, said method comprising:
    switching said integrated circuit device into a low power mode;
    generating a BIST wake-up signal during or before entering said low power mode;

initiating a built-in self test when receiving said BIST wake-up signal, and
providing a trigger signal to a process safety timer when switching said integrated circuit device into said low power mode and generating said BIST wake-up signal depending on an expiration of said process safety timer.

* * * * *